US006533470B2

United States Patent
Ahrens

(10) Patent No.: US 6,533,470 B2
(45) Date of Patent: Mar. 18, 2003

(54) SINGLE-PIECE CAGE FOR PLUGGABLE FIBER OPTIC TRANSCEIVER

(75) Inventor: Michael E. Ahrens, Campbell, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 187 days.

(21) Appl. No.: 09/810,820

(22) Filed: Mar. 16, 2001

(65) Prior Publication Data

US 2002/0131725 A1 Sep. 19, 2002

(51) Int. Cl.[7] .................................................. G02B 6/36
(52) U.S. Cl. ............................ 385/88; 385/92; 385/135
(58) Field of Search ............................... 385/88, 89, 90, 385/91, 92, 94, 134, 135

(56) References Cited

U.S. PATENT DOCUMENTS

| 4,767,179 A | * | 8/1988 | Sampson et al. ............. 385/88 |
| 5,067,785 A | * | 11/1991 | Schirbl et al. ................ 385/92 |
| 5,528,408 A | | 6/1996 | McGinley et al. ........... 359/152 |
| 5,864,468 A | | 1/1999 | Poplawski et al. .......... 361/753 |
| 5,879,173 A | * | 3/1999 | Poplawski et al. ............ 385/92 |
| 2002/0150344 A1 | * | 10/2002 | Chiu et al. .................... 385/88 |

OTHER PUBLICATIONS

"Small Form–factor Pluggable (SFP) Transceiver Multi-Source Agreement (MSA)"; Sep. 14, 2000; pp. 1–38.

* cited by examiner

Primary Examiner—Hemang Sanghavi
(74) Attorney, Agent, or Firm—Bever, Hoffman & Harms, LLP; Patrick T. Bever

(57) ABSTRACT

A cage for mounting a pluggable fiber optic transceiver onto a host circuit board. The cage is entirely formed from a single blank, which is folded along predefined fold lines to form top, bottom, and side walls that are secured by a latch. A series of semi-resilient feet extend downward from the cage and are pressed into corresponding plated holes provided in the host circuit board such that the cage is secured to the circuit board without soldering. The feet are integrally formed on the blank during the blank stamping process such that they extend perpendicular to the bottom wall after the folding process. Each foot is has an elongated oval outer edge and defines an eye-shaped opening that facilitates resilient deformation when pressed into the plated holes of the host circuit board.

18 Claims, 5 Drawing Sheets

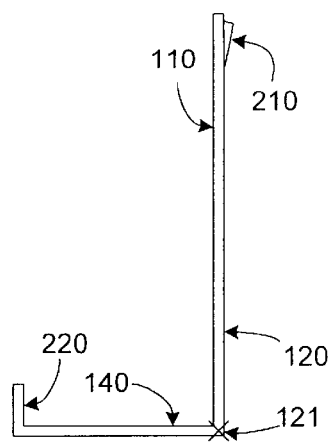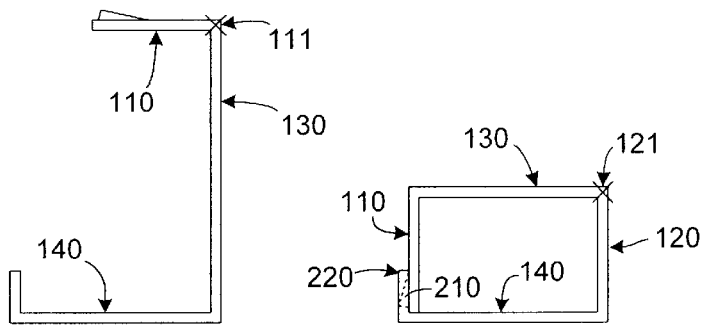
FIG. 5A  FIG. 5B  FIG. 5C
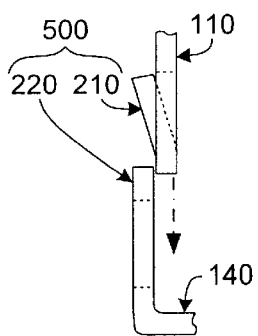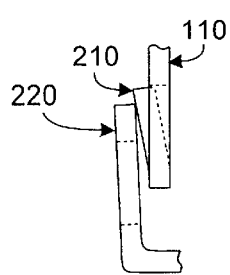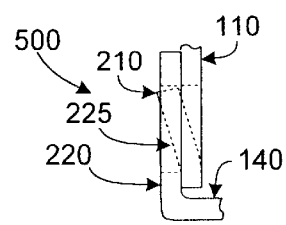
FIG. 6A  FIG. 6B  FIG. 6C

US 6,533,470 B2

SINGLE-PIECE CAGE FOR PLUGGABLE FIBER OPTIC TRANSCEIVER

FIELD OF THE INVENTION

This invention relates to fiber optic (optoelectronic) communications, and more particularly to pluggable fiber optic transceivers utilized in fiber optic systems.

BACKGROUND OF THE INVENTION

Fiber optic transceivers facilitate bi-directional data transmissions between electronic devices (e.g., computer, input/output system, peripheral device, or switch) and optical data links in fiber optic (optoelectronic) systems. Each transceiver includes a photodetector for converting optically encoded data received from an optical data link to electrically encoded data readable by a host electronic device, and a laser diode for converting electrically encoded data signals from the host electronic device that are converted into optical signals and transmitted to the optical data link. Each transceiver is mounted onto a circuit card assembly of the host electronic device, and is therefore typically packaged such that it occupies as little circuit card surface area as possible.

Small Form-factor Pluggable (SFP) transceivers are one type of transceiver having standardized physical dimensions and performance characteristics that are defined in the "Cooperation Agreement for Small Form-Factor Pluggable Transceivers", as executed on Sep. 14, 2000 (herein "the Cooperation Agreement"), which is incorporated herein in its entirety. The Cooperation Agreement is part of an SFP Transceiver multi-source agreement whose purpose is to establish internationally compatible sources of pluggable fiber optic transceivers in support of established standards for fiber optic systems. Specifically, the Cooperation Agreement sets forth transceiver package dimensions, cage and electrical connector specifications, host circuit board layouts, electrical interface specifications, and front panel bezel requirements that are followed by each party.

As set forth in the Cooperation Agreement, the transceiver electronics of each SFP Transceiver are mounted in an elongated transceiver housing that is designed for "pluggable" insertion into a cage assembly. The cage assembly is mounted onto a host circuit board over a female electrical connector, and includes a front opening for receiving the transceiver housing. The transceiver housing includes a male connector board located at a back end thereof that is plugged into the female electrical connector when the transceiver housing is inserted into the cage. Located at a front end of the transceiver housing are receptacles for receiving standard optical connectors (e.g., duplex LC, MT-RJ, or SG connectors).

The cage assembly, as described in the Cooperation Agreement, includes a bottom portion that is soldered to a host circuit board, and a top portion that is detachably mounted onto the bottom portion after soldering. Soldering is used to provide electrical connection between the host circuit board and the cage assembly, which serves a ground plane for the SFP transceiver inserted therein. The top and bottom portions are stamped or otherwise cut from thin sheet metal, folded along predetermined fold lines and then coupled to form the lower, side, and upper walls of the cage assembly. The lower wall, which is part of the bottom portion, defines an opening through which the female electrical connector extends when the bottom portion is soldered to the host circuit board. The side walls extend upward from the lower wall, and support the upper and back walls when the top portion is mounted on the bottom portion. The front opening of the cage assembly, through which the SFP transceiver is inserted, is defined by the lower, upper and side walls when the top portion is mounted on the bottom portion.

Recently, several problems with the conventional cage assembly have become apparent to those who install and maintain SPF transceivers.

First, the soldering process needed to connect the bottom portion of the cage assembly to a host circuit board introduces a time consuming processing step that significantly increases production costs. Further, if the bottom portion is damaged after soldering, the entire host board, which often includes several tens of SPF transceivers, must be taken "off line" in order to remove the solder connecting the damaged bottom portion to the host circuit board.

A second problem associated with the conventional cage assembly is that mounting the top portion onto the bottom portion requires a time consuming and tedious manual assembly operation that can result in damage to the cage assembly and/or the female electrical connector. Note that the detachable top portion allows access to the female electrical connector for troubleshooting purposes without having to remove the bottom portion, which is soldered to the host circuit board. However, the need to remove cage assembly top portions for troubleshooting female electrical connectors occurs infrequently, but the manual assembly operation must be performed each time a cage assembly is initially installed on a host circuit board.

What is needed is a mechanism for connecting a pluggable fiber optic transceiver cage to a host circuit board that both avoids the soldering step and provides the necessary electrical (ground) connection between the cage and the host circuit board. What is also needed is a cage that avoids the manual assembly operation while facilitating convenient access to the female electrical connector after installation.

SUMMARY OF THE INVENTION

The present invention is directed to a single-piece (integral) cage for pluggable fiber optic transceivers that is easy to install on and remove from a host circuit board. The cage includes side walls that are integrally connected along upper fold lines to a top wall, and one side wall is integrally connected along another fold line to a bottom wall. A back wall is integrally connected to the top wall by yet another fold line. An opening is provided in the bottom wall such that the cage can be mounted as a single unit over a female connector, which becomes enclosed by the top, side and back walls. The side, top, and bottom walls are arranged to form a front opening through which a pluggable fiber optic transceiver can be inserted to connect with the female connector.

In accordance with an aspect of the present invention, the single-piece cage is formed from a single blank that is stamped from sheet metal and folded along predetermined fold lines and secured by a latching mechanism. A first portion of the latch mechanism (e.g., a tab having a central opening) extends from a first edge of the blank, which in one embodiment is located on a bottom wall of the cage. A second portion of the latching mechanism is formed by bending a tab that is located adjacent to a second edge of the blank, which in one embodiment corresponds to a side wall of the cage. The second portion has a fixed end integrally connected to the side wall, and a free end that extends at a predefined angle relative to the side wall. The first latch portion is bent perpendicular to the bottom wall during the blank folding process, and slides along the free end of the second portion during assembly. When the cage is closed such that the side wall contacts the bottom wall, and the first portion resiliently snaps over the free end of the second portion, which presses against an inner edge of the central opening to lock the cage into the closed position. By forming the entire cage from a single blank that includes the latch structure, the cage is significantly less difficult to install on a host circuit board than conventional two-part cage assemblies that require a tedious manual assembly operation.

In accordance with another aspect of the present invention, a series of feet extend downward from the cage and are pressed into corresponding plated holes provided in the host circuit board, thereby securing the cage to the circuit board without soldering. The feet are integrally formed on the blank during the blank stamping process such that they extend perpendicular to the bottom wall after the folding process. Each foot is has an elongated oval outer edge with a narrow fixed end, a relatively wide central portion, and a narrow free end. Each foot defines an eye-shaped opening that facilitates resilient deformation of the foot when the cage is mounted on the host circuit board. Specifically, the free end of the foot is pressed into a corresponding plated hole on the host circuit board until the wide central portion presses against the sides of the opening. When sufficient pressing force is applied, the eye-shaped opening facilitates a slight resilient deformation of the wide central portion that, when fully inserted into the plated hole, generates sufficient pressing force to secure the cage to the host circuit board. In addition, the pressing force exerted by each foot against the corresponding plated holes produces the necessary electrical (i.e., ground) connection between the cage and the host circuit board. When a particular female electrical connector must be accessed after the cage is mounted on a host circuit board, the cage is conveniently removed by applying sufficient tensile force to pull the feet from their respective plated holes. Accordingly, the feet secure the cage to the host circuit board without requiring solder or other permanent fasteners, thereby facilitating easy and convenient mounting and removal for servicing of the female connector.

BRIEF DESCRIPTION OF THE DRAWINGS

These and other features, aspects and advantages of the present invention will become better understood with regard to the following description, appended claims, and accompanying drawings, where:

FIGS. 5A, 5B, and 5C are simplified side views showing the formation of side, top, and bottom walls of the single-piece cage by folding the blank shown in FIG. 2 along major fold lines;

FIGS. 6A, 6B, and 6C are partial side views showing a latch of the single-piece cage being engaged during the folding step shown in FIG. 6C;

DETAILED DESCRIPTION OF THE DRAWINGS

Figure 1:
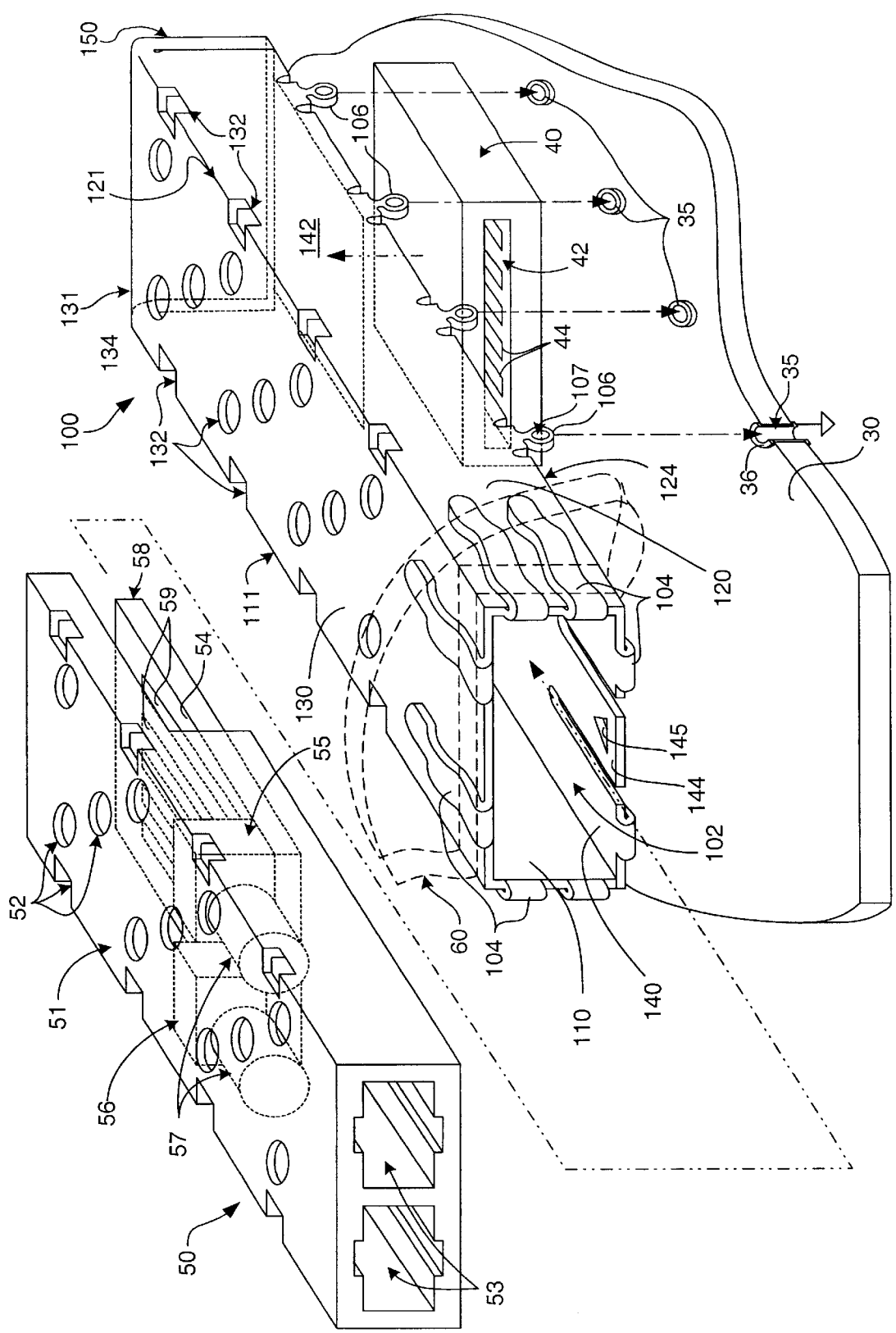
FIG. 1 is an exploded perspective view showing a transceiver assembly including a single-piece cage in accordance with an embodiment of the present invention.

FIG. 1 is an exploded perspective view showing a transceiver assembly 10 including a host circuit board 30 upon which is mounted a female electrical connector 40, a pluggable transceiver 50, and a single-piece cage 100. An optional bezel (face plate) 60, indicated in dashed lines, is mounted onto a front portion of cage 100 and host circuit board 30. In accordance with the disclosed embodiment, pluggable transceiver 50 is an SFP Transceiver as set forth in the Cooperation Agreement (cited above), and host circuit board 30, female electrical connector 40, and bezel 60 are produced in accordance with standards established in the Cooperation Agreement. Further, single-piece cage 100 includes dimensions that are consistent with the standards set forth in the Cooperation Agreement for the two-part cage assembly. However, those skilled in the production of such cages will recognize that various aspects of single-piece cage 100 that are described below may be modified by known methods to house smaller or larger pluggable fiber optic transceivers, or other types of pluggable electronic devices.

Referring to the lower right portion of FIG. 1, host circuit board 30 includes a series of connection holes 35 that are plated with a conductive material 36 (e.g., copper), and are connected to a ground source (or another predetermined voltage potential). As described below, connection holes 35 are utilized to secure cage 100 to host circuit board 30, and to provide electrical connection between cage 100 and the ground source.

Female electrical connector 40 is mounted on an upper surface of host circuit board 30. Female connector 40 defines a connector slot 42 that exposes several contacts 44 for providing electrical connection between pluggable transceiver 50 and an electrical device (not shown) that is connected to host circuit board 30.

Referring to the upper left portion of FIG. 1, pluggable transceiver 50 is depicted in a simplified form. Pluggable transceiver 50 generally includes a plastic housing 51 having an upper surface defining several vent holes 52, and a front surface defining pair of receptacles 53. Mounted within housing 51 is a circuit board 54 for supporting the transceiver electronics, which process data signals from and supply data signals to a photodetector 55 and a laser diode 56, respectively. A pair of ferrules 57 are mounted in receptacles for aligning standard optical connectors (not shown) with photodetector 55 and laser diode 56. Extending from the back end of circuit board 54 is a male connector card 58 including contacts 59 that mate with corresponding contacts 44 of female connector 40 when cage 100 is mounted on host circuit board 30 and pluggable transceiver 50 is fully inserted into cage 100, as described below.

Referring to the center of FIG. 1, cage 100 includes a first side wall 110, a second side wall 120, a top wall 130, and a bottom wall 140 that collectively define a front opening 102 for receiving pluggable transceiver 50. Cage 100 also includes a back wall 150.

The terms "integrally connected" and "integrally formed" are used herein to define a connection between two regions of a single molded or forged structure. For example, a sheet of metal that is forged or otherwise formed can be bent into two portions that are integrally connected along the fold line. The term "integrally connected" is intended to be distinguished from mechanical connections that take place after two structures are formed, such as welding, gluing, or fastening by mechanical fastener.

In accordance with a first aspect of the present invention, the walls of cage 100 are integrally formed by a single sheet metal blank (described below) that is folded along predetermined fold lines and secured by an integrally formed latching mechanism (also described below) to erect the three-dimensional cage 100. Specifically, first side wall 110 is integrally connected along its upper edge (fold line) 111 to one edge of top wall 130. Similarly, second wall 120 is integrally connected along its upper edge 121 to the opposite edge of top wall 130, and integrally connected along its lower edge 124 to one edge of bottom wall 140. Back wall 150 (shown in dashed lines) is integrally connected to top wall 130 along back edge (fold line) 131. As described in additional detail below, by forming cage 100 entirely from a single blank that includes walls 110, 120, 130, 140, and 150, cage 100 is less difficult to install on host circuit board 30 than conventional two-part cages, discussed above, because the entire cage is mounted and removed as a single unit.

According to another aspect of the present invention, cage 100 includes a series of feet 106 extending downward from lower edges of side wall 110, side wall 120, and back wall 150. Each foot 106 includes a elongated oval outer edge and defines an elongated ("eye" shaped) central opening 107 that facilitates semi-resilient coupling when pressed into a corresponding plated connection hole 35 provided in host circuit board 30, thereby securing cage 100 to the circuit board without soldering. Specifically, when sufficient downward force is applied to cage 100, eye-shaped openings 107 facilitates a slight resilient deformation of the relatively wide central portion of each foot 106 that, when fully inserted into plated connection holes 35, generates sufficient pressing force to secure cage 100 to host circuit board 30. In addition, the pressing force exerted by each foot 106 against corresponding plated holes 35 produces the necessary electrical (i.e., ground) connection between cage 100 and host circuit board 30. Accordingly, cage 100 reliably facilitates the grounding function provided by the conventional two-piece cage assembly (discussed above) without having to perform a time consuming soldering process.

Further, when female electrical connector 40 must be accessed after cage 100 is mounted onto host circuit board 30, cage 100 is conveniently removed by applying sufficient upward force to pull feet 106 from their respective plated holes 35, thereby obviating the need for the separate upper and lower cage portions utilized in the conventional two-part cage assembly. Accordingly, the single-piece structure of cage 100 provides significantly easier installation without sacrificing access to female connector 40 for trouble shooting purposes.

In addition to the structures discussed above, cage 100 includes several features provided in accordance with standards set forth in the Cooperation Agreement. First, a series of resilient clips 104 are formed by folding elongated tabs extending from walls 110, 120, 130, and 140. Clips 104 are utilized to provide electrical connection between cage 100 and optional bezel 60. Second, a series of vent holes 132 are formed on top wall 130 that align with vent holes 52 formed in transceiver housing 51 (discussed above). These vent holes cooperate with an optional system ventilation (cooling) system to maintain transceiver 50 at a desired operating temperature. Finally, bottom wall 140 includes a transceiver latch 144 that defines a latch opening for receiving a boss (not shown) provided on a lower surface of transceiver housing 51 to secure transceiver 50 inside cage 100.

Figure 2:
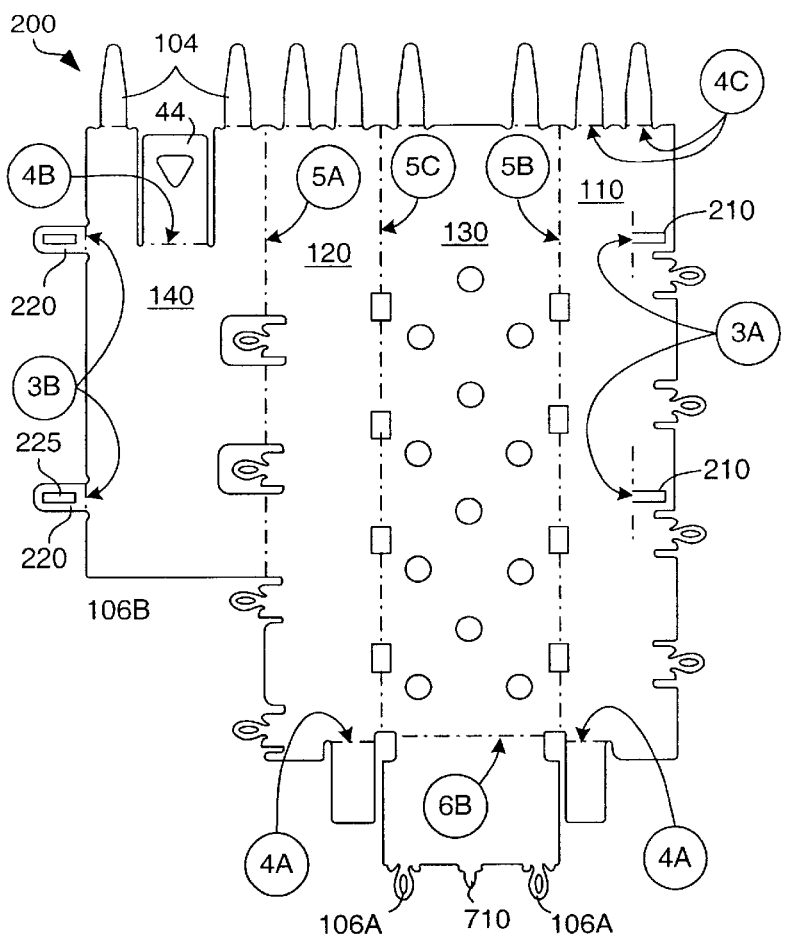
FIG. 2 is plan view showing a blank used to form the single-piece cage of FIG. 1.

FIG. 2 is a plan view showing a sheet metal blank 200 that is processed in accordance with the folding operation discussed below to form cage 100. In one embodiment, blank 200 is formed from 0.01" thick 301 stainless steel, ½ hard, which produces a cage 100 having superior rigidity and durability. Other materials and thicknesses may be selected to reduce cost and/or increase or decrease rigidity. Fold lines are indicated by bubbled reference numbers, which correspond to the figure number in which the indicated fold line is discussed.

Figure 3A:
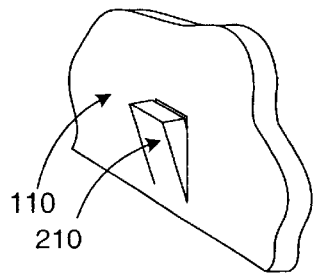
FIGS. 3A and 3B are perspective views showing the formation of cage latch members by bending associated portions of the blank shown in FIG. 2.

Referring to the right side of FIG. 2 and to FIG. 3A, the folding process begins with the formation of latch fingers 210 that are located on side wall 110. Each latch finger 210 is formed by stamping (cutting) blank 200 and bending finger 210 outward relative to wall 110 as indicated in FIG. 3A. Note that a fixed (i.e., lower) end of latch finger 210 remains integrally connected to side wall 110, and the free (upper) end is separated from the surface of side wall 110. The stamping and bending processes may be combined into a single step, or can be performed in separate steps (e.g., with stamping taking place when blank 200 is initially formed).

Figure 3B:
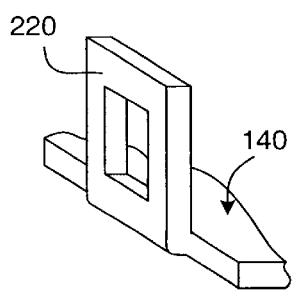

Referring to the left side of FIG. 2 and to FIG. 3B, a next step of the folding process includes the formation of latches 220, which are located on bottom wall 140. Specifically, each latch 220 is bent perpendicular to bottom wall 140, as indicated in FIG. 3B.

Figure 4B:
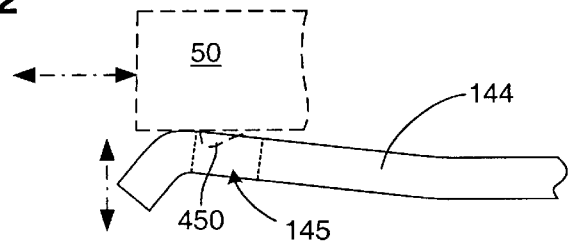
FIGS. 4A, 4B, and 4C are partial side views showing the formation of various cage structures by bending various portions of the blank shown in FIG. 2.
Figure 4A:
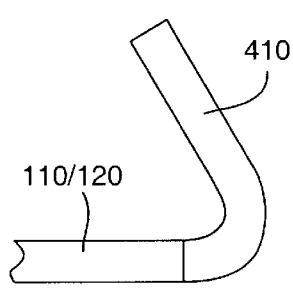
Figure 7A:
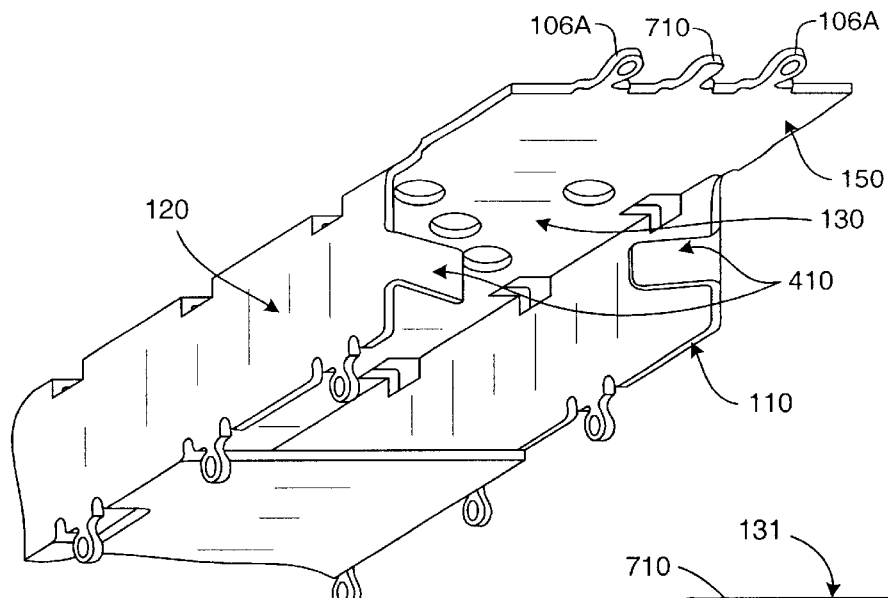
FIGS. 7A and 7B are perspective views showing formation of the back wall of the single-piece cage.

Referring to the lower portion of FIG. 2 and to FIG. 4A, a next step of the folding process includes the formation of kick-out springs 410, which are located on a back edge of side walls 110 and 120, and are used to bias an inserted transceiver 50 toward front opening 102 (see FIG. 1). Specifically, each kick-out spring 410 is bent perpendicular to its associated side wall 110/120, as indicated in FIG. 3B. Kick-out springs 410 are also shown in FIG. 7A, which is discussed below.

As indicated at the top of FIG. 2 and in FIG. 4B, a next step of the folding process includes forming latch 144 into a bowed shape such that it applies an upward pressure against a subsequently inserted transceiver 50. Specifically, after cage 100 is fully formed and transceiver 50 is inserted (i.e., moved to the right in FIG. 4B), a boss 450 located on a bottom surface of transceiver 50 passes over and is latched into triangular opening 145 (shown in FIG. 1). In this latched state, movement of transceiver 50 out of cage 100 (i.e., to the left in FIG. 4B) is prevented by the contact between boss 450 and latch 144. Subsequent manipulation of latch 144 (i.e., downward in FIG. 4B) releases boss 450, thereby allowing removal of transceiver 50.

Figure 4C:
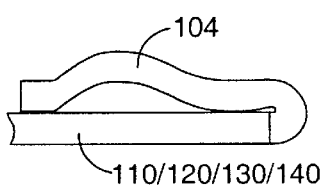

Also indicated at the top of FIG. 2 and in FIG. 4C is the subsequent step of forming resilient clips 104, which are located on the front edge of side walls 110 and 120, top wall 130, and bottom wall 140. Each resilient clip 104 is bent using known methods into the bowed shape indicated in FIG. 4C to provide reliable contact between cage 100 and bezel 60 (see FIG. 1).

Referring to the upper portion of FIG. 2, blank 200 is then folded along major fold lines 5A, 5B, and 5C such that side walls 110 and 120, top wall 130 and bottom wall 140 form front opening 102 (see FIG. 1). These folding steps are depicted using simplified end views shown in FIGS. 5A, 5B, and 5C. Specifically, FIG. 5A depicts the step of folding side wall panel 120 relative to bottom wall panel 140 along fold line 5A (indicated by the "X") to form edge 121 (also shown in FIG. 1). Note that latch 220 is already perpendicular to bottom wall 140, and that finger 210 is extended out of the plane defining side wall 110. Next, FIG. 5B depicts the step of folding side wall panel 110 relative to top wall panel 130 along fold line 5B (indicated by the "X") to form edge 111. Finally, side wall 120 is folded relative to top wall 130 along fold line 5C (indicated by the "X") to form edge 121. Note that this final fold brings side wall 120 down onto bottom wall 140, there causing latch finger 210 to mate with latch 220.

FIGS. 6A through 6C illustrate in additional detail the latching process between latch finger 210 and latch 220, which collectively form a latching mechanism 500. As indicated in FIG. 6A, as the fold shown in FIG. 5C nears completion, a lower edge of side wall 110 approaches bottom wall 140 and latch 220. As shown in FIG. 6B, as latch finger 210 passes over the upper end of latch 220, latch 220 is pushed outward and/or latch finger 210 is pushed inward to provide the necessary clearance. Finally, as shown in FIG. 6C, the upper end of finger 210 enters opening 225, inner wall 110 and latch 220 return to their normal, unstressed state, thereby locking side wall 110 to bottom wall 140 (i.e., engaging latching mechanism 500). Subsequently, upward movement of side wall 110 relative to bottom wall 140 is prevented by contact between the upper end of latch finger 210 and the inside upper edge defining opening 225.

Figure 7B:
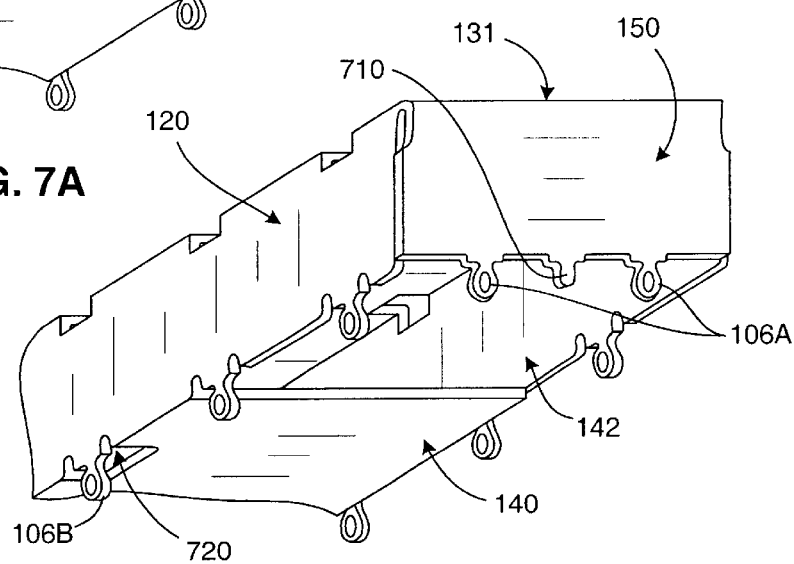

Referring to the lower portion of FIG. 2 and to FIGS. 7A and 7B, the final step of the folding process includes bending back wall panel 150 downward relative to top wall 130 along fold line 7A (shown in FIG. 2) such that back wall 150 extends perpendicular to top wall 130 and is connected along back edge (fold line) 131. Note that back wall 150 includes two additional feet 106B and a centrally-located positioning pin 710 that are received in corresponding holes (not shown) when the cage is mounted on a host circuit board.

Referring again to FIGS. 2 and 7B, note that bottom wall 140 does not extend to back wall 150, thereby providing lower opening 142 for receiving female electrical connector 40 (see FIG. 1). Note also that a portion of bottom wall 140 is removed to form feet 106B, which are located in openings 720. As shown in FIG. 7B, when side wall 120 is bent relative to bottom wall 140, feet 106B remain in the (vertical) plane defined by side wall 120, and openings 720 remain in the (horizontal) plane defined by bottom wall 140.

Referring again to FIG. 1, at the conclusion of the folding process, described above, single-piece cage 100 is fully formed and ready for mounting on host circuit board 30. As indicated by the vertical arrows, this mounting process involves inserting feet 106 into plated holes 35 of host circuit board 30.

Figure 8A:
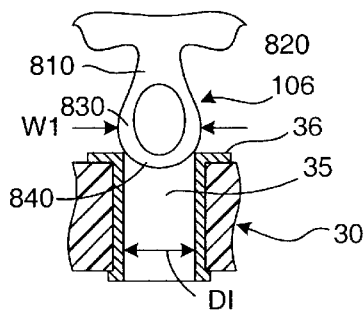
FIGS. 8A, 8B, and 8C are simplified side views showing a foot of the single-piece cage as it is inserted in a plated hole of a host circuit board.
Figure 8B:
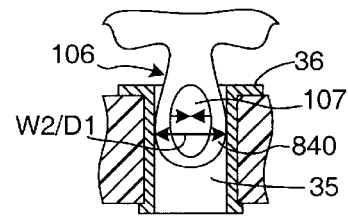
Figure 8C:
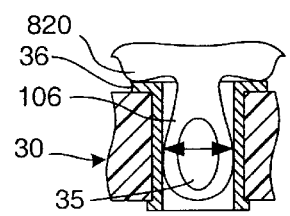

FIGS. 8A through 8C are partial side views showing the insertion of feet 106 into plated connection holes 35 of host circuit board 30. Each foot 106 includes a relatively narrow fixed end 810 extending from a pair of shoulders 820, a relatively wide central portion 830, and a relatively narrow free end 840. As mentioned above, each connection hole 35 is plated with a conductive material 36 (e.g., copper) to provide electrical conduction between foot 106 and a grounding source (not shown) that is coupled to conductive material 36. Referring to FIG. 8A, central portion 830 of each foot 106 has an initial width W1 that is slightly larger than the inner diameter D1 of plated hole 35. As shown in FIG. 8B, when foot 106 is inserted into plated hole 35, central portion 840 is deformed inward, thereby partially collapsing eye-shaped central opening 107, until the compressed width W2 of foot 106 is substantially equal to inner diameter D1 of plated hole 35. Because foot 106 is provided with eye-shaped central opening 107, this inward deformation is resilient such that foot 106 presses outward against conductive plating material 36, thereby providing reliable electrical connection between foot 106 and conductive material 36. As shown in FIG. 8C, foot 106 is subsequently pushed downward until shoulders 820 contact the upper portion of plated hole 35 (e.g., conductive plating material 36 located on the upper surface of host circuit board 30 around plated hole 35).

Figure 9:
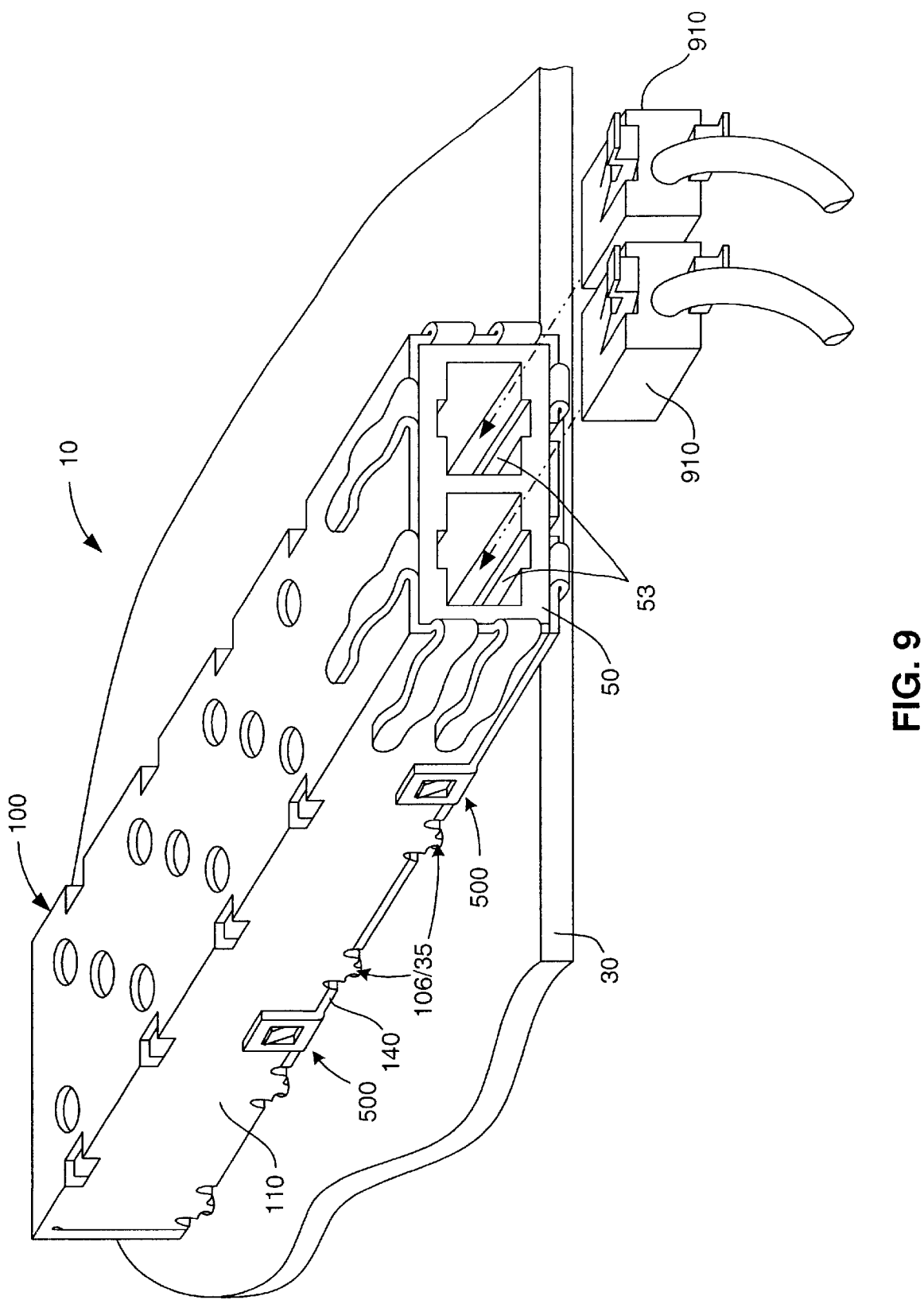
FIG. 9 is a perspective view showing the cage mounted on the host circuit board and the transceiver inserted therein.

FIG. 9 is a perspective view showing transceiver assembly 10 in an assembled form. Specifically, cage 100 is mounted on host circuit board 30 in the manner described above (i.e., with feet 106 inserted into plated holes 35), and transceiver 50 inserted into cage 100 such that transceiver 50 is coupled to female electrical connector 40 (shown in FIG. 1). Note that side wall 110 and bottom wall 140 of cage 100 are securely coupled by a pair of latch mechanisms 500 (discussed above). During operation in a host fiber optic system, standard fiber optic connectors 910 are inserted into receptacles 53 of transceiver 50 for communication between and electronic device (not shown), which includes host circuit board 30, an external optical link (not shown).

Although the present invention has been described with respect to certain specific embodiments, it will be clear to those skilled in the art that the inventive features of the present invention are applicable to other embodiments as well, all of which are intended to fall within the scope of the present invention. For example, the specific order of steps associated with the folding process described herein is exemplary and in no way intended to be limiting.

What is claimed is:

1. A cage for housing a fiber optic transceiver, the cage comprising:

first and second side walls having first edges;

a first transverse wall integrally connected between second edges of the first and second side walls;

a second transverse wall integrally connected along the first edge of the second side wall; and a latching mechanism including a first portion integrally formed on the first side wall, and a second portion integrally connected to a second edge of the second transverse wall, wherein the first and second portions are engaged to secure the second transverse wall to the second side wall.

2. The cage according to claim 1, wherein the first portion of the latching mechanism comprises a tab defining a central opening, the tab being bent perpendicular to the second transverse wall, and wherein the second portion of the latching mechanism comprises a finger having a fixed end connected to the first side wall, and a free end extending from a plane defined by the first side wall and being received in the central opening of the tab.

3. The cage according to claim 1, wherein the first and second side walls, the first transverse wall and the second transverse wall define a front opening for receiving the fiber optic transceiver.

4. The cage according to claim 1, further comprising a back wall integrally connected along a fold line to the first transverse wall.

5. The cage according to claim 4,
wherein the first and second side walls define back edges located adjacent to the back wall, and
wherein the cage further comprises first and second kick-out springs respectively integrally connected along the back edges of the first and second side walls.

6. The cage according to claim 1, wherein the first and second side walls, the first transverse wall and the second transverse wall are formed from a single-piece sheet metal blank.

7. The cage according to claim 1, wherein at least one of the first and second side walls includes a foot extending from the first edge thereof, the foot comprises a relatively narrow fixed end, a relatively wide central portion, and a relatively narrow free end, and wherein the foot defines a central opening.

8. A cage for a housing a fiber optic transceiver, the cage comprising:
first and second side walls having first edges, at least one of the first and second side walls including a foot extending from the first edge thereof;
a first transverse wall integrally connected between second edges of the first and second side walls; and
a second transverse wall integrally connected to the first side wall along the first edge,
wherein the foot includes a relatively narrow fixed end, a relatively wide central portion, and a relatively narrow free end, and
wherein the foot defines an elongated central opening.

9. The cage according to claim 8, wherein the first and second side walls, the first transverse wall, the second transverse wall, and the foot are formed from a single-piece sheet metal blank.

10. The cage according to claim 8, further comprising means for latching the first side wall to the second transverse wall.

11. The cage according to claim 8, further comprising a back wall integrally connected along a fold line to the first transverse wall.

12. The cage according to claim 11,
wherein the first and second side walls define back edges located adjacent to the back wall, and
wherein the cage further comprises first and second kick-out springs respectively integrally connected along the back edges of the first and second side walls.

13. A fiber optic transceiver assembly comprising:
a circuit board and having a female connector mounted thereon;
a cage mounted on the circuit board such that the female connector is enclosed by the cage, the cage defining a front opening; and
a pluggable fiber optic transceiver mounted in the cage such that a male connector of the transceiver is received in the female connector, and one or more receptacles are exposed adjacent to the front opening of the cage;
wherein the cage comprises a plurality of feet, each foot extending into a corresponding connection hole formed in the circuit board,
wherein each foot includes a relatively narrow fixed end, a relatively wide central portion, and a relatively narrow free end, and
wherein the foot defines an elongated central opening.

14. The fiber optic transceiver assembly according to claim 13, wherein each connection hole formed in the circuit board is plated with an electrically conductive material.

15. The fiber optic transceiver assembly according to claim 13, wherein the cage further comprises:
first and second side walls having lower edges, wherein the plurality of feet are integrally connected to the lower edge;
a top wall integrally connected between upper edges of the first and second side walls;
a bottom wall integrally connected to the second side wall along its lower edge; and
a back wall integrally connected to the top wall along a back edge,
wherein the first and second side walls, the top wall and the bottom wall define the front opening of the cage.

16. The fiber optic transceiver assembly according to claim 15, wherein the cage further comprises a latching mechanism including a first portion integrally formed on the first side wall, and a second portion integrally connected to a second edge of the bottom wall, wherein the first and second portions are engaged to secure the bottom wall to the second side wall.

17. The cage according to claim 16,
wherein the first portion of the latching mechanism comprises a tab defining a central opening, the tab being bent perpendicular to the bottom wall, and
wherein the second portion of the latching mechanism comprises a finger having a fixed end connected to the first side wall, and a free end extending from a plane defined by the first side wall and being received in the central opening of the tab.

18. The cage according to claim 15, wherein
wherein the cage further comprises a latch member integrally connected to the bottom wall, and a kick-out spring integrally connected to the first side wall,
wherein the pluggable fiber optic transceiver includes a housing that is biased toward the front opening of the cage by the kick-out spring, and includes a boss secured by the latch member.

* * * * *

UNITED STATES PATENT AND TRADEMARK OFFICE
Certificate

Patent No. 6,533,470 B2    Patented: March 18, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Michael E. Ahrens, Campbell, CA; and Andreas Stockhaus, Berlin, Germany.

Signed and Sealed this Second Day of August 2005.

RODNEY B. BOVERNICK
*Supervisory Patent Examiner*
Art Unit 2874

UNITED STATES PATENT AND TRADEMARK OFFICE
CERTIFICATE OF CORRECTION

PATENT NO. : 6,533,470 B2
DATED : March 18, 2003
INVENTOR(S) : Michael E. Ahrens It is certified that error appears in the above-identified patent and that said Letters Patent is hereby corrected as shown below:

Title page,
Item [57], ABSTRACT,
Line 11, delete "is".

Column 7,
Line 62, replace "is.plated" with -- is plated --.

Column 9,
Line 17, delete "a" (first occurrence).

Column 10,
Line 46, delete "wherein".

Signed and Sealed this

Twenty-third Day of August, 2005

JON W. DUDAS
*Director of the United States Patent and Trademark Office*